United States Patent [19] [11] 4,408,678

White, Jr. [45] Oct. 11, 1983

[54] LOUDSPEAKER ENCLOSURE

[76] Inventor: Lahroy A. White, Jr., 4008 Pinehurst, Amarillo, Tex. 79109

[21] Appl. No.: 350,217

[22] Filed: Feb. 19, 1982

[51] Int. Cl.$^3$ .............................................. H05K 5/00

[52] U.S. Cl. .................................... 181/199; 181/156; 181/144

[58] Field of Search ................................ 181/144–148, 181/151, 156, 171, 172, 199, 150; 179/146 E, 154, 155, 1 E, 1 R; 312/7 R, 7 TV

[56] References Cited

U.S. PATENT DOCUMENTS

| | | | |
|---|---|---|---|
| 1,953,410 | 4/1934 | Jacobson | 181/292 |
| 1,965,830 | 7/1934 | Hammer | 181/199 |
| 2,041,777 | 5/1936 | Olney et al. | 181/166 |
| 2,834,423 | 5/1958 | Boadgood | 181/156 |
| 2,973,824 | 3/1961 | Pinski | 181/144 |
| 2,991,840 | 7/1961 | Van Camp | 181/151 |
| 2,992,695 | 7/1961 | Everitt | 181/199 |
| 3,299,206 | 1/1967 | Klepper | 179/1 R |
| 3,473,625 | 10/1969 | Heisrath | 179/1 R |
| 3,684,051 | 8/1972 | Hopkins | 181/199 |
| 3,757,889 | 9/1973 | Everitt | 181/156 |
| 3,789,953 | 2/1974 | Everitt | 181/199 |
| 3,941,207 | 3/1976 | Croup | 181/199 |
| 3,967,065 | 6/1976 | Wood | 181/199 X |
| 4,122,911 | 10/1978 | Croup | 181/199 |

FOREIGN PATENT DOCUMENTS

| | | |
|---|---|---|
| 465441 | 5/1937 | United Kingdom . |
| 1348535 | 3/1974 | United Kingdom . |

*Primary Examiner*—Benjamin R. Fuller

*Attorney, Agent, or Firm*—Christensen, O'Connor, Johnson & Kindness

[57] ABSTRACT

A free standing frame supports front, back, side, top and bottom panels in such a manner that the panels are free to move relative to each other. Speaker drivers are mounted to the front panel such that frontwave radiation therefrom is allowed to project outwardly. Rear wave radiation is, however, contained within the enclosure formed by the panels. Deflection of the panels as a result of impinging backwave energy dissipates the backwave without producing "ringing" or other resonant effects.

9 Claims, 1 Drawing Figure

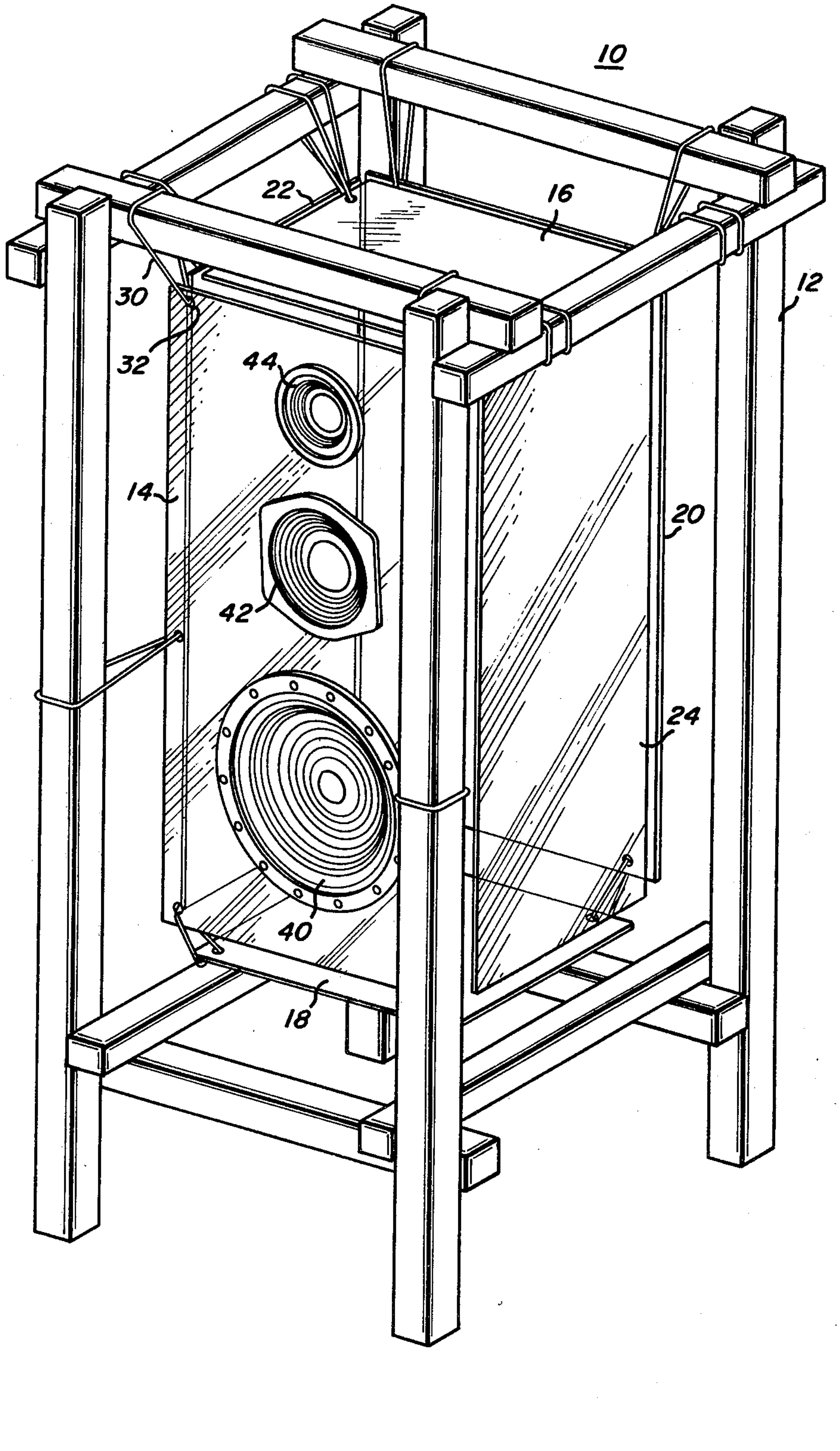
10
22
16
12
30
32
44
14
20
42
24
40
18

LOUDSPEAKER ENCLOSURE

BACKGROUND OF THE INVENTION

The present invention pertains to the acoustic art and, more particularly, to an improved loudspeaker enclosure.

Ideally, a loudspeaker system should transduce electrical signals provided by a power amplifier into a proportionate level acoustical output, of the same frequency, across the entire audio bandwidth.

In practice, however, conventional loudspeaker systems fail, particularly at low frequencies, to faithfully reproduce the electrical input. The nature of this failing is apparent upon analysis of a typical loudspeaker system. The modern speaker system is normally comprised of a box to the front side of which is mounted one or more speaker drivers. The box is normally a rigid structure made of a heavy, dense material such as metal, plywood or particle board. Great care is taken to make sure that no undesirable air leaks exist, and acoustical dampening "fill" materials are often used. The basic purpose of such an enclosure is to totally absorb backwave radiation from the speaker which would otherwise tend to cancel the desired frontwave radiation.

The basic problem with conventional speaker systems is that they develop one or more dominant low frequency resonances. These resonances result from the spring action of the air in the enclosure enforcing excursions of the driver at defined frequencies. The result is a "boominess" from the speaker system at the resonant frequencies and coloration of other frequencies.

Most of the research into refining the operating characteristics of such systems has been the tuning of the system to realize a desired compromise. To this end, tuned ports have been added to the enclosure; the volume of the enclosure has been adjusted in accordance with operating parameters of the driver; the electrical signal to the speaker has been equilized, and so forth.

While these refinements have improved the sound qualities of conventional loudspeaker systems, there yet exists in this art a long felt need for a high resolution system design, particularly at bass frequencies.

SUMMARY OF THE INVENTION

It is an object of the present invention, therefore, to provide an improved loudspeaker enclosure.

Briefly, according to the invention, an improved loudspeaker enclosure comprises a front portion, side portions and a back portion. The front portion is adapted for emitting frontwave radiation from a loudspeaker with the front, side and back portion being arranged to substantially contain the backwave radiation from the loudspeaker. At least one of the front, side and back portions is formed of a panel. This panel is mechanically suspended such that it is adapted to be deflected by backwave radiation from the loudspeaker and thereby dissipate the energy thereof.

BRIEF DESCRIPTION OF THE DRAWING

The single FIGURE illustrates a perspective view of the preferred construction of a loudspeaker enclosure according to the invention.

DETAILED DESCRIPTION OF THE PREFERRED EMBODIMENT OF THE INVENTION

The FIGURE illustrates the preferred embodiment of the improved loudspeaker enclosure, indicated generally at 10. The enclosure is comprised of a freestanding frame 12. The function of frame 12 is to provide a means of support for the suspended loudspeaker sidewall portions.

These sidewall portions comprise a front panel 14, top and bottom panels 16, 18 respectively, a back portion 20 and left and right side portions 22, 24 respectively. Each of the portions 14, 16, 18, 20, 22 and 24 is comprised of a material that is relatively rigid as well as exhibiting low acoustic resonance. In this, the preferred embodiment of the invention, the panels are comprised of $\frac{1}{8}$ inch thick plastic. The plastic may be styrene, acrylic or epoxy. Many other constructions are contemplated by the invention, such as composite material with, if necessary, attached glass wool or other dampening materials.

Each of the top, side, front and back panel portions is suspended from the frame 12 via, for example, line 30 through a provided panel hole 32. The bottom portion 18 is, in a similar manner, suspended from the front, back and side panels. The various panels are configured to form, basically, an enclosure. In this way, back radiation from a speaker complement, such as woofer 40, midrange 42 and tweeter 44 which are mounted to the front panel 14, is substantially contained within the enclosure. Frontwave radiation, however, projects from the speakers 40, 42 and 44 through cutouts provided in the front panel.

In operation, the backwave radiation from the speaker, particularly the woofer 40, strikes the inside walls of the various panels. Inasmuch as the panels are formed of low resonance material, they tend not to "ring". Moreover, inasmuch as the various panels are suspended in a manner which permits relative movement, backwave radiation from the speaker tends to deflect the various panels, thereby doing work on the panels and dissipating the backwave energy. In this way, backwave energy from the speakers is not allowed to escape the enclosure and thereby cancel frontwave radiation and the enclosure exhibits a minimal resonant characteristic. That is, whereas rigid, "airtight" enclosures tend to resonate at frequencies dependent upon their dimensions, the present, improved enclosure, exhibits very little of this resonance tendency and, in so doing, minimally "colors" the projected sound.

Listening tests between conventional enclosures and those as described herein confirm the superior sound reproducing characteristics of the present design. Bass frequencies, in particular, are reproduced with greater definition and much less "boominess". Transients, such as drumbeats, are reproduced more accurately.

While a preferred embodiment of the invention has been described in detail, it should be apparent that many modifications and variations thereto are possible, all of which fall within the true spirit and scope of the invention.

For example, whereas each of the various panels comprising a side wall of the enclosure has been illustrated as being free moving, the invention contemplates providing only one, or few of such free moving panels. While a free standing frame is shown for the preferred embodiment, there are many possible ways in which the free moving side or sides of the enclosure might be supported.

In addition, whereas a generally rectangular loudspeaker enclosure has been described in detail, it should be understood that virtually any shape might employ the present invention. Also, whereas conventional cone type speaker drivers have been shown, the present invention might be used with electrostatic or other type bi-directional drivers.

Also, whereas each of the panels is shown to consist of one piece of material, it is contemplated that they could be made up of smaller pieces of material such as acrylic plastic subsections which are arranged to be loosely attached such that their edges are in close proximity but do not touch.

I claim:

1. A loudspeaker enclosure comprising:

a front portion, side portions and a back portion, said front portion adapted for emitting frontwave radiation from a loudspeaker, said front, side and back portions being arranged to substantially contain the backwave radiation from said loudspeaker, at least one of said front, side and back portions being formed of a panel, said panel being mechanically suspended such that it is adapted to be deflected by backwave radiation from said loudspeaker and thereby dissipate the energy thereof.

2. The loudspeaker enclosure of claim 1 wherein at least two of said front, side and back portions are formed of panels, each of said panels being mechanically suspended such that they are adapted to be deflected by backwave radiation from said loudspeaker thereby dissipating the energy thereof.

3. The loudspeaker enclosure of claim 1 further including:

a freestanding frame; and means for suspending said at least one panel from said frame such that said panel is in a predetermined alignment with the remaining enclosure portions.

4. The loudspeaker enclosure of claim 2 further including:

a freestanding frame; and means for suspending said at least two panels from said frame such that said panels are in a predetermined alignment with the remaining enclosure portions.

5. The loudspeaker enclosure of either of claims 1 or 3 wherein said panel is made of plastic.

6. The loudspeaker enclosure of either of claims 2 or 4 wherein said panel is made of plastic.

7. A loudspeaker enclosure comprising:

a front panel, a pair of side panels, a top panel, a bottom panel and a back panel, each of said panels being formed of a material exhibiting a low acoustic resonance characteristic;

said front panel being provided with an opening adapted to emit frontwave radiation from a loudspeaker; and support means for aligning and supporting said panels such that backwave radiation from said loudspeaker is substantially contained, the support means suspending at least two of said panels for movement relative to the remaining panels in response to backwave radiation impingement from the loudspeaker to thereby dissipate the energy of said backwave.

8. The loudspeaker enclosure of claim 7 wherein the support means comprises:

a free standing frame;

means for suspending said panels from said frame; and means for interconnecting adjacent panels such that relative motion therebetween is permitted.

9. The loudspeaker enclosure of either of claims 7 or 8 wherein each of the panels is made of plastic.

* * * * *